(12) United States Patent
White et al.

(10) Patent No.: US 6,829,471 B2
(45) Date of Patent: Dec. 7, 2004

(54) DIGITAL BASEBAND RECEIVER IN A MULTI-CARRIER POWER AMPLIFIER

(75) Inventors: Paul E. White, York, PA (US); Thomas A. Bachman, II, Darlington, MD (US); Robert W. Kooker, Freeland, MD (US); Leonard Sarver, York, PA (US); Robert Snyder, New Freedom, PA (US); Paul Everline, Wildwood, IL (US)

(73) Assignee: Andrew Corporation, Orland Park, IL (US)

( * ) Notice: Subject to any disclaimer, the term of this patent is extended or adjusted under 35 U.S.C. 154(b) by 463 days.

(21) Appl. No.: 10/091,756

(22) Filed: Mar. 6, 2002

(65) Prior Publication Data

US 2002/0127986 A1 Sep. 12, 2002

Related U.S. Application Data

(60) Provisional application No. 60/273,987, filed on Mar. 7, 2001.

(51) Int. Cl.$^7$ ................................................. H04B 1/16
(52) U.S. Cl. ................................ 455/194.2; 455/114.3; 455/202
(58) Field of Search .......................... 455/194.2, 195.1, 455/199.1, 200.1, 202, 205, 219, 63.1, 67.11, 67.13, 63.3, 570, 114.2, 114.3, 118, 125, 126; 330/149, 139, 136, 270, 279; 375/297

(56) References Cited

U.S. PATENT DOCUMENTS

| | | | |
|---|---|---|---|
| 3,241,078 A | 3/1966 | Jones | 329/50 |
| 3,689,752 A | 9/1972 | Gilbert | 235/194 |
| 4,156,283 A | 5/1979 | Gilbert | 364/841 |
| 4,879,519 A | 11/1989 | Myer | 330/149 |
| 4,978,873 A | 12/1990 | Shoemaker | 307/498 |
| 5,023,565 A | 6/1991 | Lieu | 330/151 |
| 5,115,409 A | 5/1992 | Stepp | 364/841 |
| 5,119,040 A | 6/1992 | Long et al. | 330/140 |
| 5,130,663 A | 7/1992 | Tattersall, Jr. | 330/52 |
| 5,323,119 A | 6/1994 | Powell et al. | 330/151 |
| 5,325,095 A | 6/1994 | Vadnais et al. | 342/22 |

(List continued on next page.)

FOREIGN PATENT DOCUMENTS

| | | | |
|---|---|---|---|
| EP | 0 367 457 B1 | 3/1996 | H03F/1/32 |
| EP | 0 998 026 A1 | 5/2000 | |
| EP | 0 948 131 B1 | 3/2002 | |
| WO | WO 97/08822 | 3/1997 | H03F/1/32 |

*Primary Examiner*—Tony T. Nguyen
(74) *Attorney, Agent, or Firm*—Wood, Herron & Evans, L.L.P.

(57) ABSTRACT

A power amplifier system and method for locating carrier frequencies across a frequency band, identifying the modulation format of each carrier, and locating and suppressing undesired intermodulation distortion (IMD) products generated by the power amplifier. The system includes an amplifier for amplifying RF carrier signals in a main signal path, a variable phase shifter and variable attenuator on a feed forward path, and a tunable receiver that digitizes a portion of the frequency band to baseband. The tunable receiver includes a tunable voltage controlled oscillator which provides an oscillating frequency to a mixer and is phase-locked to a highly stable reference oscillator. The mixer downconverts a desired RF based on the oscillating frequency to IF. A filter passes only a selected portion of the IF signals, and the filter has a passband sufficient to discern both narrowband and wideband carriers and their associated IMD products. Based on the locations of the carrier frequencies, a processing unit determines the IMD locations of the carrier frequencies, determines the IMD locations, and adjusts the variable phase shifter and variable attenuator on the feed forward path until the IMD products in the main signal path are suppressed below a desired threshold.

37 Claims, 5 Drawing Sheets

U.S. PATENT DOCUMENTS

| | | | |
|---|---|---|---|
| 5,414,383 A | 5/1995 | Cusdin et al. | 329/304 |
| 5,477,187 A | 12/1995 | Kobayashi et al. | 330/52 |
| 5,485,120 A | 1/1996 | Anvari | 330/151 |
| 5,491,454 A | 2/1996 | Matz | 330/149 |
| 5,528,196 A | 6/1996 | Baskin et al. | 330/151 |
| 5,594,385 A | 1/1997 | Anvari | 330/149 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,691,668 A | 11/1997 | Yoshikawa et al. | 330/151 |
| 5,760,646 A | 6/1998 | Belcher et al. | 330/149 |
| 5,808,512 A | 9/1998 | Bainvoll et al. | 330/151 |
| 5,809,400 A * | 9/1998 | Abramsky et al. | 455/63.1 |
| 5,831,478 A | 11/1998 | Long | 330/52 |
| 5,862,459 A | 1/1999 | Charas | 455/114 |
| 5,877,653 A | 3/1999 | Kim | 330/149 |
| 5,892,397 A | 4/1999 | Belcher et al. | 330/149 |
| 5,907,798 A * | 5/1999 | Abramsky et al. | 455/249.1 |
| 5,909,645 A * | 6/1999 | Abramsky et al. | 455/249.1 |
| 5,912,586 A | 6/1999 | Mitzlaff | 330/149 |
| 5,923,214 A | 7/1999 | Mitzlaff | 330/52 |
| 5,933,766 A | 8/1999 | Dent | 455/103 |
| 5,986,499 A | 11/1999 | Myer | 330/52 |
| 6,052,023 A | 4/2000 | Myer | 330/2 |
| 6,075,411 A * | 6/2000 | Briffa et al. | 330/149 |
| 6,091,715 A | 7/2000 | Vucetic et al. | 370/277 |
| 6,118,339 A | 9/2000 | Gentzler et al. | 330/149 |
| 6,125,266 A | 9/2000 | Matero et al. | 455/126 |
| 6,144,255 A | 11/2000 | Patel et al. | 330/151 |
| 6,148,185 A | 11/2000 | Maruyama et al. | 455/115 |
| 6,154,641 A | 11/2000 | Zhang | 455/112 |

* cited by examiner

DIGITAL BASEBAND RECEIVER IN A MULTI-CARRIER POWER AMPLIFIER

CROSS-REFERENCE TO RELATED APPLICATIONS

This application claims the benefit of U.S. Provisional Patent Application Ser. No. 60/273,987, filed Mar. 7, 2001 by Paul E. White et al., which application is incorporated by reference herein.

FIELD OF THE INVENTION

This invention relates generally to radio frequency (RF) power amplifier systems, and more particularly to a method and apparatus for locating and suppressing intermodulation distortion (IMD) products in a multi-carrier power amplifier (MCPA) system.

BACKGROUND OF THE INVENTION

Ideally, RF power amplifiers would act linearly, faithfully reproducing an amplified RF signal at their output with no distortion. Unfortunately, in practice, physical RF power amplifiers can be non-linear and add a certain amount of unwanted distortion to a signal, which distortion is realized as IMD products. These IMD products cause interference over in the normal operating frequency range of the amplifier, which may impede proper transmission and reception of RF signals. Numerous techniques have been developed to reduce IMD products from amplified RF signals, including feed forward, predistortion, and linear amplification with non-linear components (LINC).

In multi-carrier power amplifier systems, the effects of IMD products such as interference and crosstalk may be compounded as a result of the close proximity of frequency bands. Multi-carrier power amplifiers (MCPA) therefore must operate at high drive levels in order to achieve the high linearity demanded by broadband applications. Energy leakage resulting from one band spilling over into another can undesirably degrade the signal-to-noise (SNR) ratio or bit-error rate (BER) of the proximate frequency bands.

One common technique to reduce IMD to acceptable levels is feed forward correction, whereby the IMD products are manipulated so that at the final summing point the IMD products substantially cancel out. Classic feed forward amplifiers use what is conventionally known as a pilot tone to assist in the control of the phase and gain of an error amplifier in order to minimize IMD. A pilot tone is generated and injected with the RF signals at the input to simulate an artificial signal whose frequency content is known. The amplifier produces amplified signals and simulated distortion products based on the pilot tone. At the output, a pilot tone receiver detects the simulated distortion, not the actual distortion, and the amplifier is aligned based upon minimization of the simulated distortion. However, because the amplifier is not aligned in accordance with the actual distortion products, they may not be entirely cancelled or may leak into the output, creating unwanted byproducts.

Another technique is to digitize the RF signals to baseband, filter out the desired frequency components, and then analyze the remaining undesired distortion components in a digital signal processor (DSP). This technique does not require the use of a pilot tone. The energy of these distortion components is located and measured in the DSP, and the feed forward loop is adjusted until the undesired components are eliminated. In one conventional design, for example, a feed forward amplification system uses mask detection compensation on an RF signal modulated according to a known modulation format. The RF signal is amplified, producing in-band frequency components and undesired out-of-band distortion components. The amplified signal is heterodyned to baseband so as to be centered about DC. A wide passband (1.25 MHz) bandpass filter is used to eliminate the in-band frequency components. A microprocessor queries a DSP for the energy at predetermined offsets (representative of an IMD location), and control signals adjust the gain-phase network of a feed forward network in accordance with the out-of-band distortion components.

The above approach operates in an environment where signals are modulated according to a single known modulation format (CDMA). However, such an approach would not be well suited for detecting narrowband signals such as TDMA and their associated IMD products, in part due to the wide bandwidth of the filter (1.25 MHz).

RF signals can be modulated according to any number of modulation formats which are well known in the art, including, for example, TDMA, GSM, CDMA, WCDMA, QAM, and OFDM, each of which have varying bandwidths. For example, the bandwidth for a WCDMA signal is 3.84 MHz (wideband), and the bandwidth for a CDMA signal is 1.25 MHz. By contrast, a GSM signal has a bandwidth of 250 kHz, and a TDMA signal has a bandwidth of only 30 kHz (narrowband). Thus, the bandwidth of a signal, depending on its modulation format, can vary from 30 kHz to 3.84 MHz. If the signals are located in a PCS frequency band (1930 to 1990 MHz), a narrowband tuner would require too much time to tune across the 60 MHz band, and a wideband tuner would not be able to detect the individual carriers of TDMA or GSM signals or their associated IMD products. In short, there is a tradeoff between the bandwidth of a tuner and the speed with which it can identify and eliminate IMD products.

Therefore, a need exists for a tunable receiver having a dynamic range sufficient to identify and eliminate IMD products from RF signals, particularly multi-carrier signals modulated according to both wideband and narrowband modulation formats.

BRIEF DESCRIPTION OF THE DRAWINGS

The invention and further objects and advantages thereof may best be understood by reference to the following description taken in conjunction with the accompanying drawings, in which.

DETAILED DESCRIPTION

Figure 1:
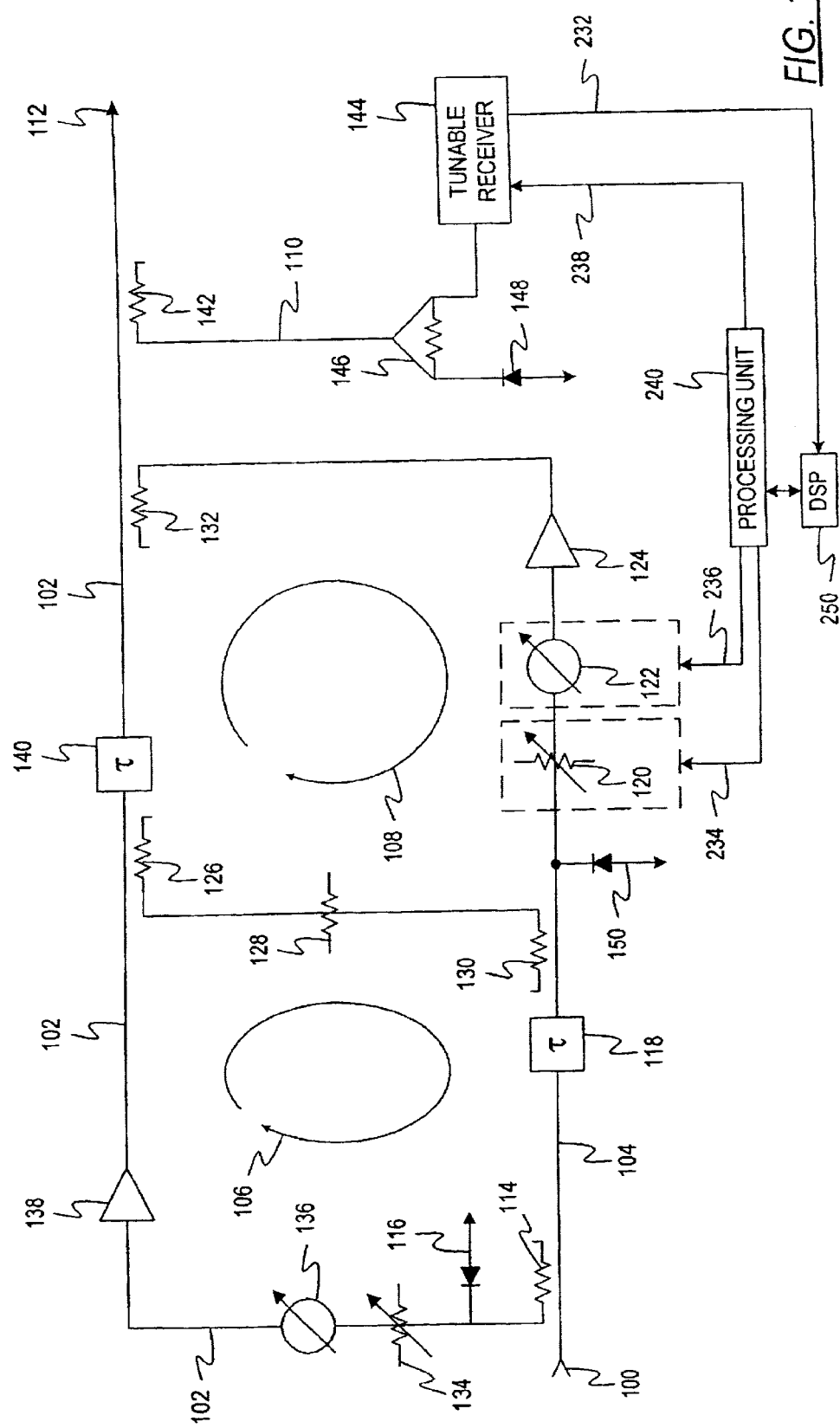
FIG. 1 is a functional diagram of a feed forward multi-carrier power amplifier circuit with a tunable receiver in accordance with one aspect of the present invention.

Although the invention will be described next in connection with certain exemplary embodiments, it will be understood that the invention is not limited to those particular embodiments. On the contrary, the description of the invention is intended to cover all alternatives, modifications, and equivalent arrangements as may be included within the spirit and scope of the invention as defined by the appended claims.

The present invention relates to an apparatus and method for locating and suppressing intermodulation distortion (IMD) products in an amplifier system. A signal path having an input and an output is configured to communicate an RF communications signal disposed in a frequency band. A tunable receiver is coupled to the signal path and configured to downconvert at least a portion of the frequency band for the RF communications signal to an Intermediate Frequency (IF) signal. A circuit arrangement is configured to convert a time domain representation of the IF signal output by the tunable receiver to a frequency domain representation, identify an IMD product from the frequency domain representation of the IF signal, and control an IMD reduction component that is coupled to the signal path to suppress the IMD product at the output of the signal path.

In an exemplary embodiment of the invention, the aforementioned apparatus and method are utilized to locate and suppress IMD products in a feed forward multi-carrier power amplifier system. In such an embodiment, an IMD reduction component is disposed in a feed forward path that is coupled to a main signal path over which an RF communications signal is communicated. The RF communications signal is typically located in a predetermined frequency band and may include any number of RF signals modulated according to any combination of wideband and narrowband modulation formats.

In the exemplary embodiment, the RF signals are amplified by a main amplifier on the main signal path, which produces both amplified RF signals and undesired IMD products. The amplified RF signals and undesired IMD products are coupled to a tunable receiver. The tunable receiver generally includes a frequency synthesizer, a mixer, a filter, and an analog-to-digital converter (ADC). A processing unit connected to the tunable receiver tunes the frequency synthesizer to a location within the frequency band, the mixer downconverts the RF signals to IF signals based on the output of the frequency synthesizer, and a filter passes only a portion of the IF signals. The filter has a sufficient bandwidth so as to discern both wideband and narrowband carriers and their associated IMD products.

The analog-to-digital converter digitizes the passed IF signals, and then provides the digitized signals to a digital signal processor (DSP). The DSP converts the digitized signals to the frequency domain for spectral analysis. The DSP may provide the power of a signal at a particular frequency or range of frequencies. During operation, the processing unit typically steps the frequency synthesizer across a selected portion of the frequency band (which may include the entire frequency band), and stores the frequency spectrum produced by the DSP at each step as a map in memory. Once a selected portion of the band has been mapped out, the processing unit detects peaks in the map and identifies those peaks as carrier signals. Optionally, the processing unit may also identify the type of modulation format of a signal based on its bandwidth and signal statistics. The processing unit also locates IMD products by detecting the power below a certain threshold (typically 20 to 30 dB below the carrier levels) and drives feed forward control elements to optimally suppress the IMD products in the main signal path.

It will be appreciated by one of ordinary skill in the art, however, that the principles of the invention may be applied to other environments. For example, the principles of the invention may be utilized in connection with single carrier RF signals, as well as in conjunction with other types of amplifier designs, e.g., amplifier designs incorporating analog and/or digital predistortion, or in other amplifier designs that inherently generate IMD products as a result of amplification. Moreover, it will be appreciated that the application of the herein-described concepts to single carrier environments, as well as other amplifier designs, would be well within the ability of one of ordinary skill in the art having the benefit of the instant disclosure. Therefore, while the invention will be described hereinafter in connection with a feed forward multi-carrier power amplifier system, the invention is not limited to the particular embodiments described herein.

FIG. 1 shows a functional diagram of a typical feed forward multi-carrier power amplifier (MCPA) circuit with a tunable receiver 144. It should be understood that feed forward circuits are well known in the art, and that the feed forward circuit shown in FIG. 1 is merely exemplary and that numerous variations of the feed forward circuit provided in FIG. 1 could be employed without departing from the spirit and scope of the present invention. According to one aspect of the present invention, the typical circuit generally includes an input 100, a main signal path 102, a feed forward path 104, and an output 112. The circuit further includes a carrier correction loop (CCL) 106, an error correction loop (ECL) 108, and a tunable receiver loop 110. On the feed forward path 104, there is provided a feed forward delay filter 118, a feed forward attenuator 120, a feed forward phase shifter 122, and a feed forward amplifier 124. On the main signal path 102, there is provided a main attenuator 134, a main phase shifter 136, a main amplifier 138, and a main delay filter 140. Note that the feed forward attenuator 120 and feed forward phase shifter 122 may be incorporated into the feed forward amplifier 124, and the gain and phase of the feed forward amplifier 124 may be controlled by gain and phase control lines (not shown). Similarly, the main attenuator 134 and main phase shifter 136 may be incorporated into the main amplifier 138.

The input 100 receives radio frequency (RF) carrier signals that collectively comprise a multi-carrier RF communications signal, and an input carrier coupler 114 couples the RF carrier signals onto both the main signal path 102 and the feed forward path 104. Alternatively, a splitter (not shown) may be used to provide the RF carrier signals onto the main signal path 102 and the feed forward path 104. The RF carrier signals may lie in any frequency band such as, for example, AMPS, DCS, PCS, UMTS, or MMDS. Furthermore, the RF carrier signals may be modulated according to any modulation format such as, for example, TDMA, GSM, CDMA, WCDMA, QAM, and OFDM, to name a few. Other modulation formats are expressly contemplated by the present invention, so long as their bandwidth is known. For example, bandwidths of the aforementioned modulation formats include: WCDMA, 3.84 MHz; CDMA, 1.25 MHz; GSM, 250 kHz; TDMA, 30 kHz. QAM-modulated signals, for example, have varying bandwidths depending on the data rate.

Referring again to FIG. 1, the RF carrier signals in the main signal path 102 may be attenuated by the main attenuator 134 and phase shifted by the main phase shifter 136, but not necessarily in that order. Optionally, a CCL power detector 150 may be provided on the feed forward path 104 to monitor the power level of the signals after the carriers have been subtracted from the CCL 106. Control of the main attenuator 134 and the phase shifter 136 may be under microprocessor control or any other suitable interface capable of monitoring the input power detector 116 and adjusting the main attenuator 134 and the phase shifter 136 in accordance with the output of the CCL power detector 150. The voltage from the CCL power detector 150 may be used to adjust the main attenuator 134 and the phase shifter 136 on the main signal path 102 to obtain maximum carrier cancellation out of the CCL 106.

Optionally, an input power detector 116 may be provided on the main signal path 102 to monitor the input power levels. For example, if the power level of a carrier signal exceeds a desired threshold, the input power detector 116 may be used to trigger an error condition, such as a reset or power down.

After the RF carrier signals have been attenuated and phase shifted, they are amplified by the main amplifier 138. For best efficiency, the main amplifier 138 typically should be driven as close to saturation as possible. As a result, the main amplifier 138 produces amplified RF carrier signals and undesired IMD products. The IMD products from one frequency channel may spill over into other frequency channels, and even may spill over into other frequency bands.

Next, the amplified RF carrier signals and undesired IMD products are time delayed by the main delay filter 140 to produce delayed amplified RF carrier signals and delayed amplified IMD products on the main signal path. Note that other suitable delay elements may be used to time-delay signals. The time delay is selected such that the amplified RF carrier signals and associated IMD products appear in the main signal path 102 at substantially the same time the adjusted carrier signals and associated IMD products from the feed forward amplifier 124 are coupled onto the main signal path 102.

Meanwhile, on the feed forward path 104, a feed forward delay filter 118 delays the RF carrier signals such that the RF carrier signals appear in the feed forward path 104 at substantially the same time the attenuated sample of the amplified RF carrier signals (and associated IMD products) are coupled onto the feed forward path 104 by a feed forward CCL coupler 130.

The carrier correction loop (CCL) 106 couples the amplified RF carrier signals and associated IMD products on the main signal path 102 onto the feed forward path 104 at the output of the feed forward delay filter 118. The CCL 106 includes (1) a main CCL coupler 126 which couples the amplified RF carrier signals and associated IMD products on the main signal path 102 onto the CCL 106, (2) a CCL attenuator 128 for attenuating the amplitude of the coupled signals, and (3) a feed forward CCL coupler 130 which couples the amplified RF carrier signals and undesired IMD products onto the feed forward path 104 at the output of the feed forward delay filter 118. The phase of the amplified RF carrier signals should be inverted with respect to the phase of the delayed RF carrier signals on the feed forward path after the feed forward delay filter 118.

The CCL attenuator 128 attenuates the coupled signals such that the amplitude of the amplified RF carrier signals is substantially equal to the amplitude of the delayed RF carrier signals on the feed forward path, in order to obtain maximum carrier cancellation. Attenuation resulting from the main CCL coupler 126 and the feed forward CCL coupler 130, as well as the gain of the main amplifier 138, should be taken into consideration when selecting the attenuation factor for the CCL attenuator 128. The CCL attenuator 128 produces attenuated RF carrier signals and attenuated IMD products. After coupling by the feed forward CCL coupler 130, the two out-of-phase carrier signals cancel each other such that primarily isolated IMD products remain on the feed forward path 104, though some carrier products may also be present. These isolated IMD products are attenuated and phase inverted with respect to the IMD products at the output of the main amplifier 138, so that the two signals will cancel each other when combined.

Figure 2:
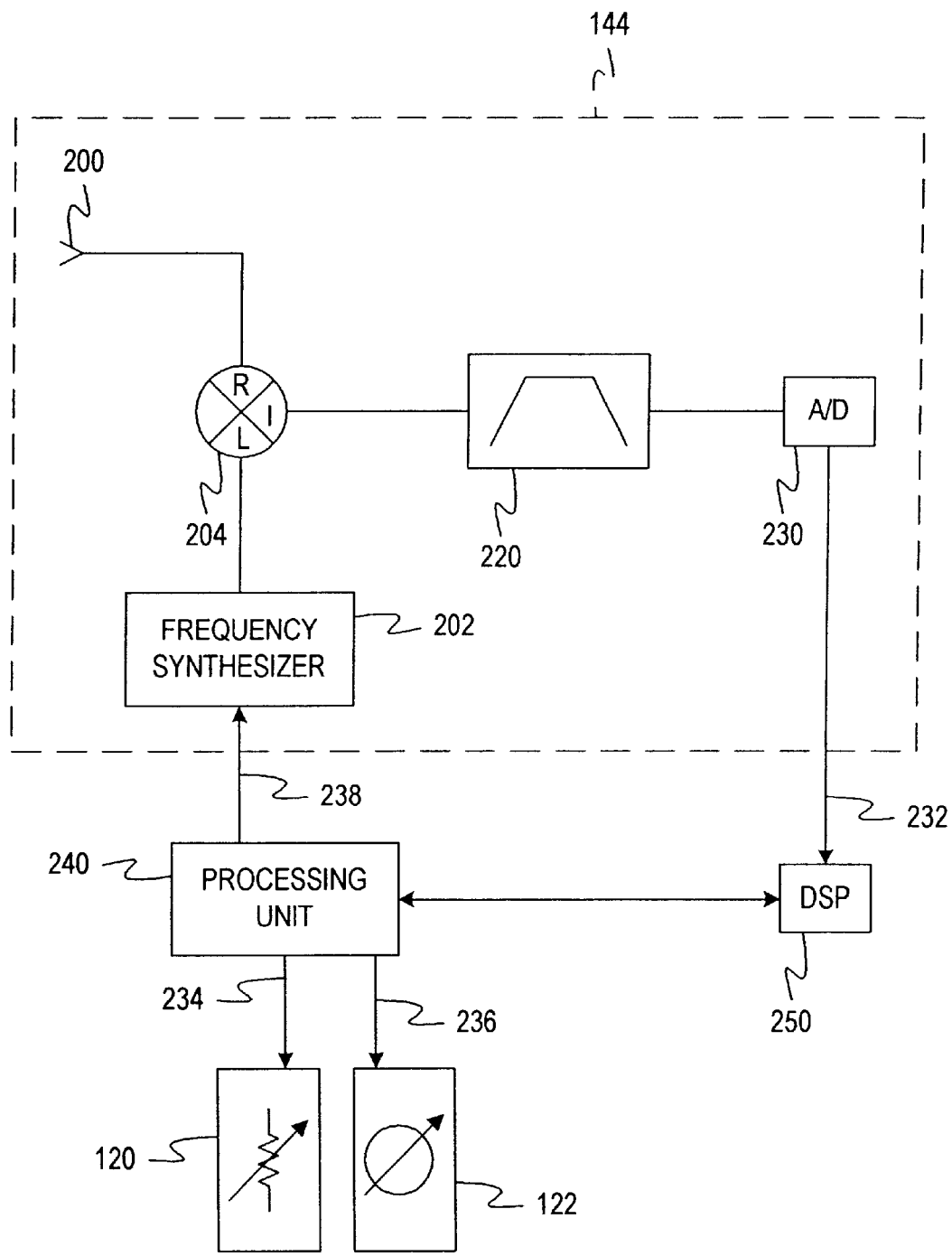
FIG. 2 is a functional diagram of a tunable receiver in accordance with one aspect of the present invention.

The isolated IMD products are presented to the feed forward attenuator 120, the feed forward phase shifter 122, and the feed forward amplifier 124 before entering the error correction loop (ECL) 108. Note that the feed forward attenuator 120 and feed forward phase shifter 122 may be incorporated into the feed forward amplifier 124. The amplitude of the isolated IMD products may be attenuated by the feed forward attenuator 120, and the phase of the isolated IMD products may be shifted by the feed forward phase shifter 122, but not necessarily in that order. The feed forward control elements, attenuator 120 and feed forward phase shifter 122, are under the control of a processing unit 240 as shown in FIG. 2 as will be explained in more detail later. The processing unit 240 could include more than one unit. For example, the processing unit 240 could include a control unit (not shown) for controlling the feed forward control elements.

In the illustrated embodiment, the feed forward attenuator 120 and feed forward phase shifter 122 function as IMD reduction components that are controlled by the processing unit 240. In other embodiments, however, other types and combinations of IMD reduction components, typically including one or more phase shifters and/or attenuators disposed within various signal paths in an amplifier design, may be used in the alternative.

The attenuated and phase-shifted IMD products are amplified by a feed forward amplifier 124. The gain of the feed forward amplifier 124 is selected such that the IMD products are substantially eliminated at the output 112. The feed forward amplifier 124 is typically driven in its linear region below saturation to avoid creating non-linear distortion products in the ECL 108.

The feed forward amplifier 124 produces amplified IMD products whose phase is inverted with respect to the phase of the delayed amplified IMD products on the main signal path 102. The amplitudes of the amplified IMD products and the delayed amplified IMD products are substantially identical. Because they are also phase inverted, when they are coupled by the main ECL coupler 132 onto the main signal path 102, the amplified IMD products and the delayed amplified IMD products substantially cancel each other so that IMD products are essentially eliminated from the main signal supplied to the main output 112.

The resultant amplified RF carrier signals (and their associated IMD products, if any) are coupled onto a tunable receiver loop 110 by a tunable receiver coupler 142. Optionally, a splitter 146 may provide the amplified RF carrier signals to both the tunable receiver 144 and to an output power detector 148. Optionally, the output power detector 148 may detect the power of the amplified RF signals. For example, the output power detector 148 may monitor the output power of the main amplifier 138 for abnormalities, and trigger a fault isolation loop when, for example, too much power is detected.

Figure 3:
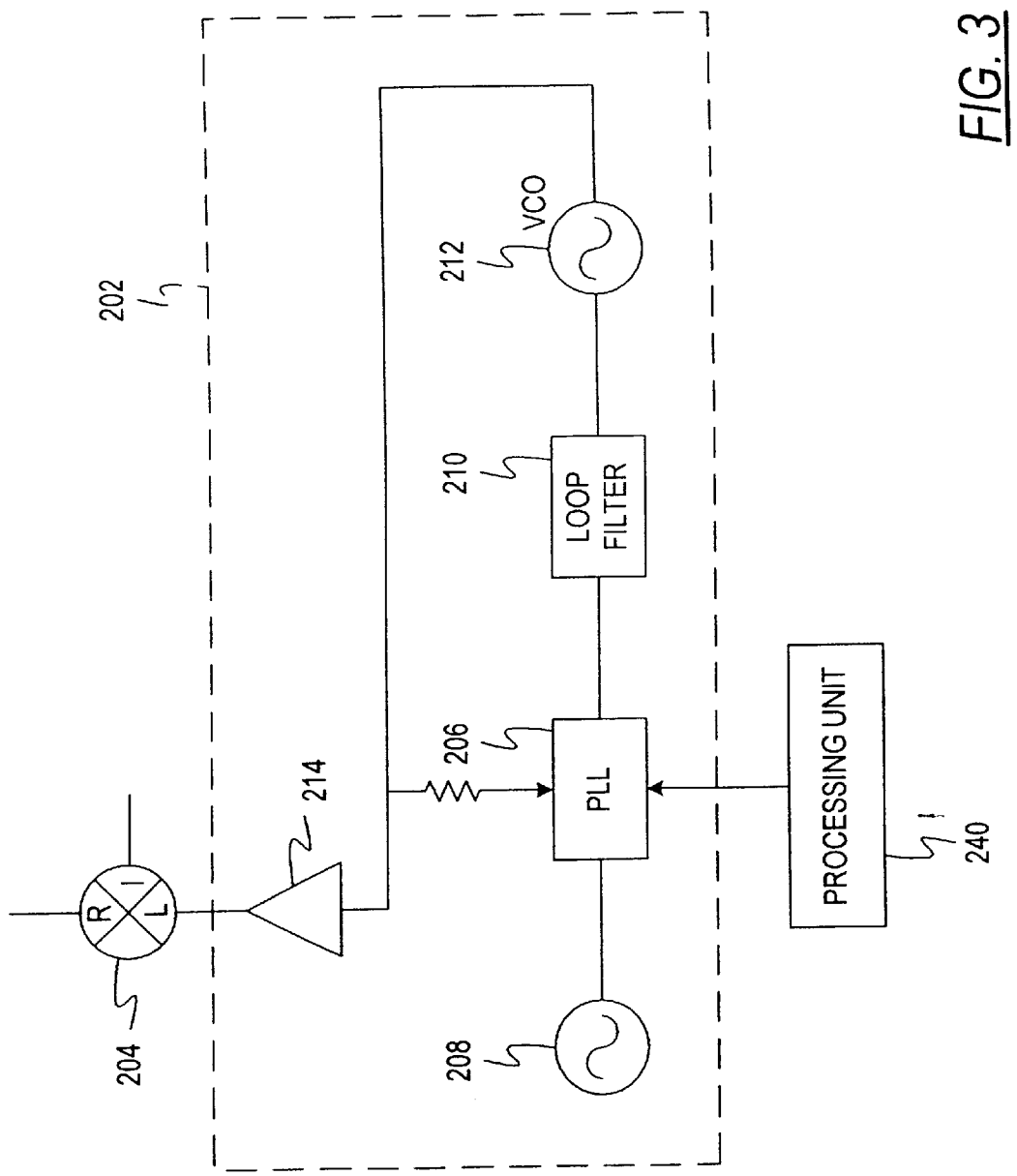
FIG. 3 is a functional diagram of a frequency synthesizer in accordance with a specific aspect of the present invention.

FIG. 2 is a functional diagram of a tunable receiver in accordance with one aspect of the present invention. The tunable receiver generally includes a receiver input 200, a downconverter that includes a frequency synthesizer 202 and a mixer 204, an IF filter 220, and an analog-to-digital converter 230. In one embodiment, the frequency synthesizer 202 is a direct digital synthesizer, though other frequency synthesizers could be employed. In the exemplary embodiment shown in FIG. 3, the frequency synthesizer includes a phase-locked loop (PLL) synthesizer 206, a reference oscillator 208, a loop filter 210, and a voltage controlled oscillator (VCO) 212. The PLL synthesizer 206 is driven by the highly stable reference oscillator 208, which optionally may be a temperature controlled crystal oscillator (TCXO), so that the VCO 212 will hold its assigned frequency over wide temperature gradients. In one aspect of the present invention, the reference oscillator 208 oscillates at 10 MHz, but other frequencies may be employed depending on the operating range of the frequency band, the PLL synthesizer 206 design specifications, and other considerations. The loop filter 210 is connected between the PLL synthesizer 206 and VCO 212 and cleans the PLL synthesizer 206 output to prevent rippling or modulation of the VCO 212. The loop filter 210 may be selected in accordance with design specifications such as bandwidth, phase margin, settling time, and loop order. For example, in the exemplary embodiment, the loop filter 210 is a third order filter with a bandwidth of 10–20 kHz.

The output of the VCO 212 may be optionally provided to an LO amplifier 214, which amplifies the output of the VCO 212 to a range necessary to drive the LO input of the mixer 204. Referring back to FIG. 2, the mixer 204 heterodynes a portion of the frequency band based on a known frequency from the VCO 212 to an Intermediate Frequency (IF). The known frequency may be any frequency in the band plus the IF offset. The known frequency is provided to the frequency synthesizer 202 by the processing unit 240 via synthesizer control line 238. In the exemplary embodiment, the mixer 204 is a Hittite HMC175MSB mixer. However, it is understood that any other suitable heterodyning mixer may be used.

Still referring to FIG. 2, the IF output of the mixer 204 is provided to an IF filter 220 which has a predetermined pass bandwidth. For example, the pass bandwidth of the IF filter 220 could be in the range of about 300 kHz to greater than about 10 MHz. The width of the pass bandwidth for IF filter 220 will depend in part on the speed of the digital signal processor 250, the speed of the analog-to-digital converter 230, the quality of the mixer, the types of narrowband signals to be detected, the cost of the power amplifier unit, and other considerations. Note that the smaller the pass bandwidth, the more time it will take to tune across the entire band. The wider the pass bandwidth, the more difficult it becomes to detect narrowband signals, such as TDMA-modulated signals. These two considerations, speed and accuracy, must be balanced in selecting the pass bandwidth of the IF filter 220. In an exemplary embodiment only, the pass bandwidth of the IF filter is about 1.23 MHz, though it is expressly contemplated that other pass bandwidths may be selected. As the speed of DSPs and A/D converters increases, much wider filter bandwidths may become feasible, for example. Furthermore, in some embodiments, it may not even be necessary to step across a desired portion of a frequency band. Rather, the bandwidth of the filter may be sufficient to analyze the desired portion in a single pass.

The IF filter 220 thus provides a portion (about 1.23 MHz in the exemplary embodiment) of the baseband signals to an analog-to-digital converter 230, which digitizes the portion of IF signals. Optionally, an amplifier (not shown) may be provided after the IF filter 220 to compensate for insertion loss and to set the drive level to the analog-to-digital converter 230. The digitized IF signals are provided to a digital signal processor (DSP) 250 which transforms the digitized baseband signals to a frequency domain representation in the frequency domain for spectral analysis. In the exemplary embodiment, the transformation is performed by a Fast Fourier Transform (FFT). Other transformation algorithms may be employed depending on resolution and speed considerations. The DSP 250 identifies the frequency components and the power level at each frequency.

Note that for different frequency bands, a family of power amplifiers may be provided. For example, the family may include a power amplifier operable in the AMPS frequency band, another in the PCS frequency band, and yet another in the UMTS frequency band. Each power amplifier in the family would be capable of receiving both wideband and narrowband carriers, and suppressing IMD products associated with each carrier.

Figure 4:
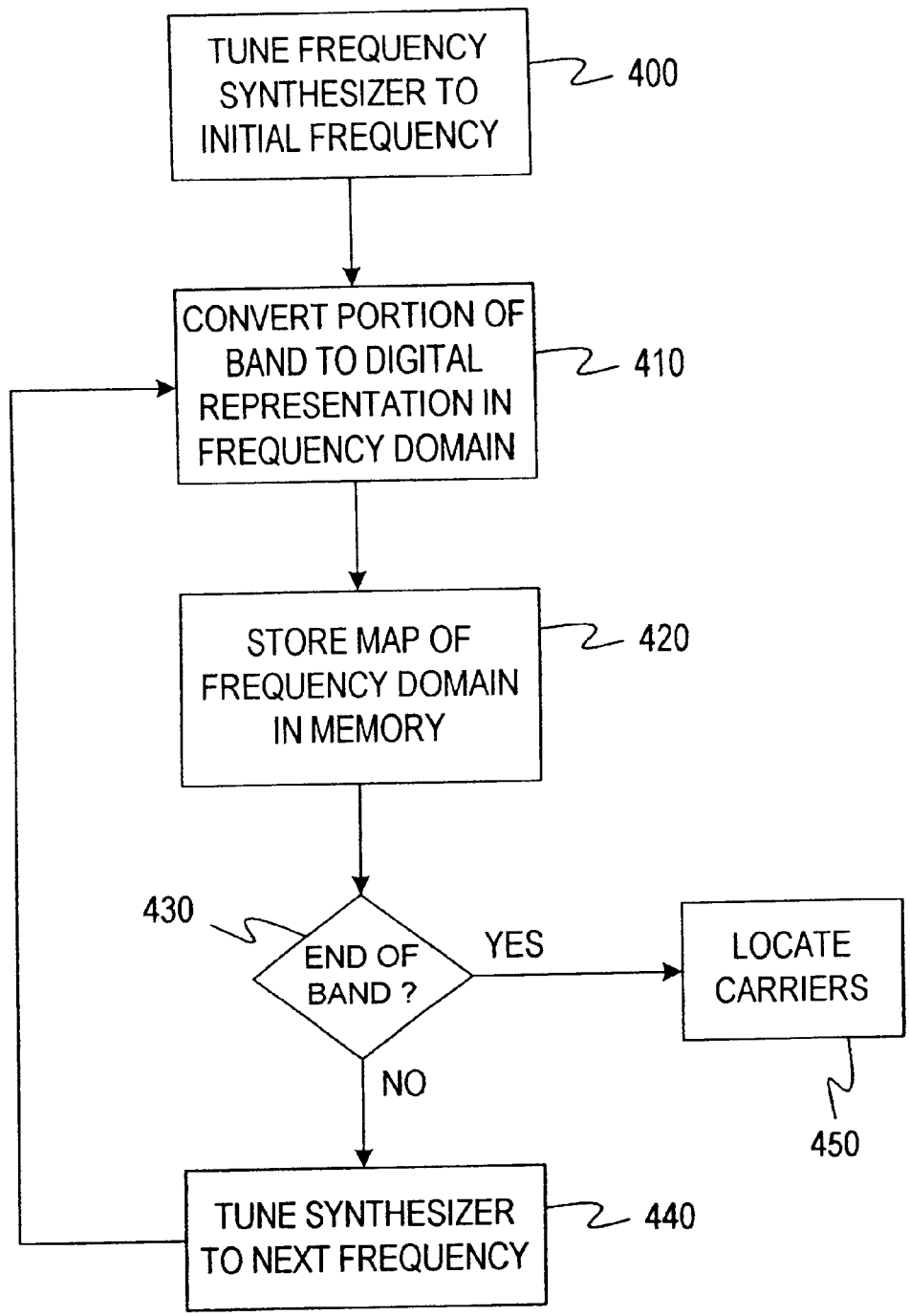
FIG. 4 is a diagrammatic chart of a carrier search algorithm in accordance with a specific aspect of the present invention.

FIG. 4 shows a diagrammatic chart of a carrier search algorithm in accordance with a specific aspect of the present invention. These instructions may be stored in a firmware in the processing unit 240 and executed when signal activity is detected at input 100, such as when the input power detector 116 outputs a voltage greater than a threshold, for example. First, at power up or during operation of the power amplifier, the processing unit 240 tunes the frequency synthesizer 202 to downconvert a portion of the frequency band centered around an initial frequency (400). The initial frequency may be representative of the beginning of the frequency band. For example, the beginning of the UMTS band is 2110 MHz. Or, the initial frequency may be representative of the beginning of the frequency allocated for a particular operator. For example, a PCS operator may only be allocated 1945 to 1960 MHz in the PCS band. In that case, the initial frequency may be approximately 1945 MHz. It is expressly taught that the tunable receiver in the present invention does not have to be instructed to scan the entire frequency band, but rather may scan only a portion of it.

After downconversion, the A/D converter 230 digitizes the IF signals passed by the IF filter 220, and the DSP 250 converts the digitized portion to the frequency domain. The resulting frequency spectrum is mapped out by the processing unit 240 (410). The digitized portion of the frequency spectrum could be subdivided into smaller subchannels, such as 5 kHz or 10 kHz subchannels, depending on speed considerations and how much resolution is desired. The power representative of the frequencies in each subchannel may be stored (420) in, for example, a two-dimensional array where the columns include the frequencies in the subchannels (or values representative thereof) and the rows include the power representative of the frequencies in each corresponding subchannel (or values representative thereof). In this fashion, the frequency spectrum across the entire portion of the band to be analyzed (remember the entire frequency band need not be scanned) can be mapped in memory. The memory may be any suitable memory device, and may be incorporated into the processing unit 240 or may be separate therefrom.

After the processing unit 240 maps out and stores the frequency spectrum of the selected portion of the frequency band (420), the processing unit determines whether the end of the band has been found (430). Again, the end of the band is operator-dependent. One operator may require tuning across an entire frequency band, but another operator may require tuning across only a specific portion of the frequency band, such as, for example, 2130 MHz to 2150 MHz in the UMTS band. Note that the end of the UMTS band is 2170 MHz, but this operator would only require that a selected 20

MHz portion of the band be mapped out. Returning to FIG. 4, if the processing unit 240 determines that the end of the band is reached (430), the processing unit will begin to locate the carriers (450). Otherwise, the processing unit 240 tunes the frequency synthesizer to the next frequency (440), which, in the exemplary embodiment, is the previous frequency plus 1.23 MHz. This process is repeated until the end of the band is found (430). Again, the end of the band is defined by the operator, not by the frequency band.

Optionally, if the frequency band has a constant channel configuration, such as the UMTS frequency band, the processing unit 240 can also determine whether the channel configuration is valid. For example, the UMTS band is subdivided into 6 blocks containing up to 4 carrier channels each.

In another embodiment, the processing unit 240 may scan first for wideband signals, locate the wideband carriers, and then scan selected portions of the frequency band where narrowband carriers may be located. In this embodiment, the frequency synthesizer 202 may be incremented in larger steps during the first scan depending on which wideband carrier is sought to be located. For example, for WCDMA signals, the frequency synthesizer 202 may be incremented in much larger steps than for CDMA signals. Stepping the frequency synthesizer 202 by 1.23 MHz steps when scanning across a 5 MHz-wide portion of the spectrum is inefficient. Less resolution is required, and thus the frequency synthesizer 202 may be instructed to "skip" certain portions of the spectrum to a location where a carrier might be located. Note that depending on the bandwidth of the IF filter 220, some portions of the band may not be mapped out. After mapping, the processing unit 240 may detect, for example, whether a wideband signal is present by analyzing the power levels across the digitized portion of the band. If a boundary is detected, the frequency synthesizer 202 may "jump ahead" to a location proximate to where a carrier location is predicted to occur, and may be instructed to begin tuning across that location.

Once the processing unit 240 has scanned for the wideband carriers, it may thereafter retune the frequency synthesizer 202 to locations where narrowband carriers may be located for finer analysis of those locations. For example, it may be known a priori that some channels in the band will contain only CDMA signals, while other channels in the band will contain only TDMA signals. For optimal speed, the processing unit 240 may first quickly scan in large steps for CDMA carriers in the channels allocated to receive CDMA signals, and then scan in smaller steps for TDMA carriers in the channels allocated to receive TDMA signals.

However, if the modulation formats of the incoming carriers are not known in advance or if the modulation format has a variable bandwidth, it may be necessary to step through the band in incremental steps. For example, if the signals are QAM-formatted, the bandwidth of each carrier may vary depending on the data rate. Or, if uniquely formatted carriers are present, and it is not known in which channels they will appear, it may be necessary to step through the band in incremental steps.

Still referring to FIG. 4, the processing unit 240 may locate the carriers a number of ways. In the exemplary embodiment, the processing unit 240 scans the map stored in a memory (420), and looks in a lookup table for power peaks. The lookup table contains information about the threshold power of each carrier for each modulation format. This information may be stored in advance or it may be created by the processing unit 240 by mapping out the entire band, and then determining the power peaks across the band. This power peak detection may be performed by simply comparing the power at one frequency with the power at a previous frequency, and if the difference exceeds a predetermined threshold within a certain frequency range, the power level at that frequency may be recorded in the lookup table along with the modulation format.

Figure 5:
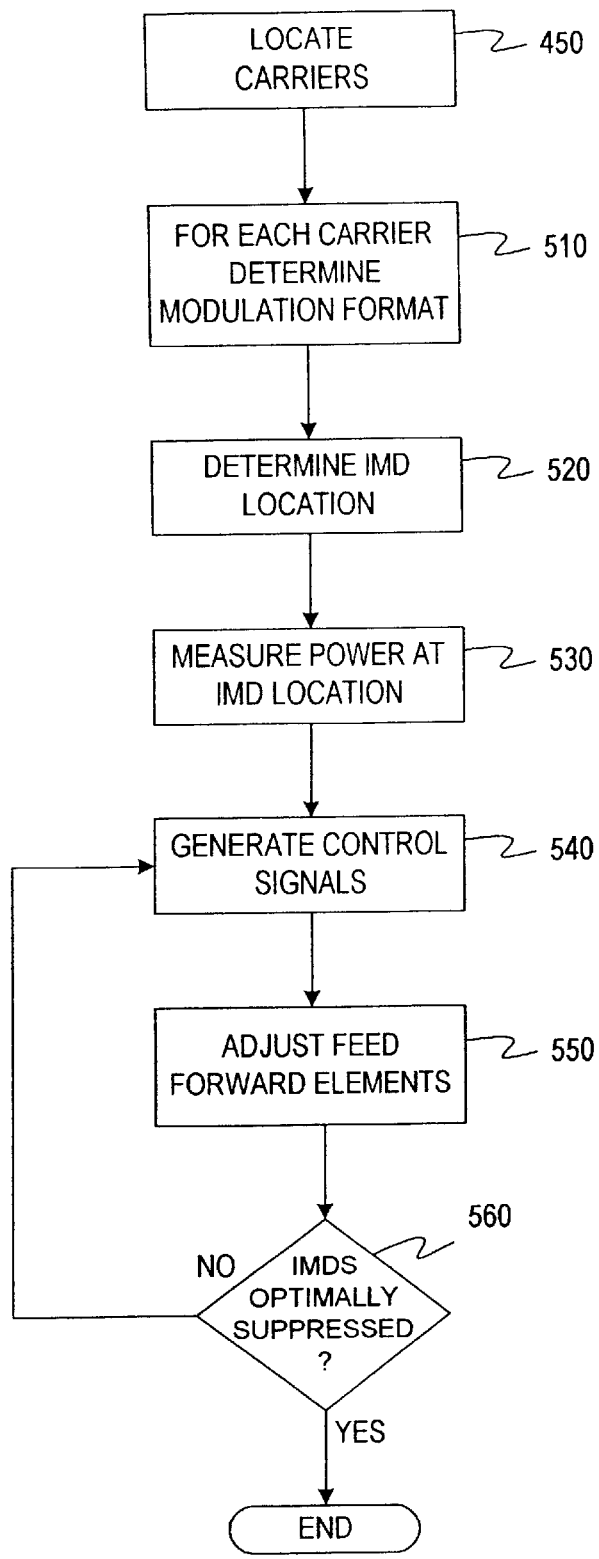
FIG. 5 is a diagrammatic chart of an IMD suppression algorithm in accordance with a specific aspect of the present invention.

Turning now to FIG. 5, once the carriers have been located (450), for each carrier, the modulation format may be determined (510) and stored in a memory location. The modulation formats of each signal are determined by measuring the bandwidths of the signals across the mapped out frequency spectrum. If, for example, the power stays relatively constant across a 5 MHz portion of the band, the processing unit 240 may identify that signal as a WCDMA signal. A 30 kHz-wide signal in the band may indicate that a TDMA signal is present, and the processing unit 240 may store the power level of that signal along with its detected modulation format (TDMA) in the lookup table. Note that determining the modulation formats for each signal is optional, and need not be performed.

Next, the IMD locations are determined (520). The processing unit 240 scans for signals that fall below a predetermined threshold around the carriers. For example, it is known that IMD products typically fall 20–30 dB below the carriers, so the processing unit 240 may, for each carrier, determine which signals around the carrier are at least 20–30 dB below those of the carriers. Once those signals have been found, a frequency in the signal range, e.g., in the center of the range, may be stored as an IMD location. Note that as the feed forward correction is optimized, these IMD products will fall well below the carrier levels until they are optimally suppressed below a predetermined threshold. Specifications such as Adjacent Channel Power (ACP) and Adjacent Channel Leakage Ratio (ACLR) may govern the selection of the threshold. In the exemplary embodiment, the threshold is met if the IMD products are minimized below −65 dBc.

Alternatively, the processing unit 240 may determine the locations of IMD products based on the locations of the carrier frequencies. For example, for WCDMA signals in a UMTS spectrum, the IMD products will typically fall at a known distance away from the carrier frequencies. The known distance is based on the difference between the two carrier frequencies. For example, IMD products can be found at F1−(F2−F1) where F1 is a first carrier frequency and F2 is a second (higher) carrier frequency. IMD products can also be found at F2+(F2−F1). Optionally, the processing unit 240 may also verify that it has located IMD products by measuring the power at the location and comparing the power at that location with the power at a carrier location. If the power at the IMD location is approximately 20 to 30 dB below the power at a carrier location, then IMD products have been found.

Once a location of IMD products is determined (520), the processing unit 240 tunes the frequency synthesizer 202 to the location, and monitors the power in a portion of the band centered at that location (530). Based on the power measured, the processing unit generates control signals (540), which adjust the feed forward control elements 120, 122 (550) on the feed forward path 104. After the control elements 120, 122 have been adjusted, the processing unit 240 may take another power measurement to determine whether the IMD products have been optimally suppressed (560). If not, the processing unit 240 may generate new control signals (540) to adjust the feed forward control elements 120, 122 until the IMD products are suppressed below a threshold level. In the exemplary embodiment, a gradient search/dither type (sample and step) minimization algorithm is used to optimally suppress the IMD products, though other suitable minimization algorithms may be used.

Embodiments consistent with the invention provide a number of unique advantages over conventional designs. For example, such embodiments may utilize a tunable receiver having a sufficient dynamic range and speed to quickly locate and detect both wideband and narrowband carriers and their associated IMD products, such that IMD products associated with both wideband and narrowband carriers can be suppressed. Moreover, in some embodiments, the modulation format of a carrier may be identified based on the carrier's bandwidth. Furthermore, in many embodiments, IMD products may be located and suppressed without using a pilot tone generator or a pilot tone receiver. In addition, such embodiments are often well suited to mass production, with a relatively low per-unit cost.

Various additional modifications may be made to the illustrated embodiments without departing from the spirit and scope of the invention. Therefore, the invention lies in the claims hereinafter appended.

What is claimed is:

1. An apparatus, comprising:
   (a) a signal path having an input and an output and configured to communicate an RF communications signal disposed in a frequency band;
   (b) a tunable receiver coupled to the signal path and configured to downconvert at least a portion of the frequency band to an Intermediate Frequency (IF) signal;
   (c) at least one intermodulation distortion (IMD) reduction component coupled to the signal path; and
   (d) a circuit arrangement configured to convert a time domain representation of the IF signal output by the tunable receiver to a frequency domain representation, identify an IMD product from the frequency domain representation of the IF signal, and control the IMD reduction component to suppress the IMD product at the output of the signal path.

2. The apparatus of claim 1, further comprising an amplifier disposed within the signal path.

3. The apparatus of claim 1, further comprising a feed forward path, wherein the IMD reduction component comprises a variable attenuator and a variable phase shifter disposed within the feed forward path.

4. The apparatus of claim 1, wherein the RF communications signal comprises a multi-carrier RF communications signal.

5. The apparatus of claim 1, wherein the tunable receiver comprises:
   (a) a downconverter configured to downconvert the RF communications signal to an intermediate frequency; and
   (b) a bandpass filter coupled to the downconverter and configured to pass a predetermined band of frequencies and generate therefrom the IF signal.

6. The apparatus of claim 5, wherein the bandpass filter has a pass band with a sufficient range so as to discern both wideband and narrowband RF carriers and their associated IMD products.

7. The apparatus of claim 5, wherein the downconverter comprises:
   (a) a local oscillator configured to output a local oscillator signal under the control of the circuit arrangement; and
   (b) a mixer configured to mix the local oscillator signal with the RF communications signal to downconvert the RF communications signal to the intermediate frequency.

8. The apparatus of claim 7, wherein the circuit arrangement comprises a processing unit, and wherein the local oscillator comprises a processing unit-controlled frequency synthesizer.

9. The apparatus of claim 5, wherein the bandpass filter outputs an analog IF signal, and wherein the tunable receiver further comprises an analog to digital converter configured to digitize the analog IF signal to a digital time domain representation of the IF signal.

10. The apparatus of claim 1, wherein the circuit arrangement comprises a processing unit configured to receive the IF signal from the tunable receiver, and to output a control signal to the tunable receiver to tune the tunable receiver to a predetermined frequency.

11. The apparatus of claim 10, wherein the circuit arrangement further comprises a digital signal processor (DSP).

12. The apparatus of claim 11, wherein the DSP is configured to convert the time domain representation of the IF signal to the frequency domain representation using a Fast Fourier Transform (FFT).

13. The apparatus of claim 10, wherein the processing unit is configured to sequentially tune the tunable receiver to a plurality of predetermined frequencies, and to store a frequency spectrum comprising the frequency domain representation of the IF signal when the tunable receiver is tuned to each of the plurality of predetermined frequencies.

14. The apparatus of claim 13, wherein the processing unit is configured to first tune the tunable receiver to a first plurality of predetermined frequencies to identify at least one wideband signal, and to second tune the tunable receiver to a second plurality of predetermined frequencies to identify at least one narrowband signal.

15. The apparatus of claim 10, wherein the processing unit is further configured to identify a carrier signal from the frequency domain representation of the IF signal by detecting a power peak in the frequency domain representation of the IF signal.

16. The apparatus of claim 15, wherein the processing unit is further configured to determine a modulation format for the carrier signal from the frequency domain representation of the IF signal.

17. The apparatus of claim 15, wherein the processing unit is configured to identify the IMD product by detecting a signal in the frequency domain representation of the IF signal that has a power level below a threshold used to identify a carrier signal.

18. The apparatus of claim 15, wherein the processing unit is configured to identify the IMD product based upon the location of the carrier signal.

19. The apparatus of claim 10, wherein the processing unit is further configured to tune the tunable receiver to a frequency proximate that for the IMD product and monitor a power level for the IMD product while controlling the IMD reduction component.

20. The apparatus of claim 1, wherein the frequency band is selected from the group consisting of AMPS, DCS, PCS, UMTS, MMDS, and combinations thereof.

21. The apparatus of claim 1, wherein the RF communication signal includes at least one signal modulated using a modulation format selected from the group consisting of WCDMA, CDMA, GSM, TDMA, QAM, OFDM, and combinations thereof.

22. The apparatus of claim 1, wherein the circuit arrangement is configured to identify a plurality of carrier signals from the frequency domain representation of the IF signal, and to determine from the plurality of carrier signals whether a channel configuration is valid.

23. A multi-carrier power amplifier, comprising:
(a) a main signal path having an input and an output and configured to communicate a multi-carrier RF communications signal disposed in a frequency band;
(b) an amplifier disposed within the main signal path;
(c) a feed forward path coupled to the main signal path;
(d) a tunable receiver coupled to the main signal path and configured to downconvert at least a portion of the frequency band to an Intermediate Frequency (IF) signal;
(e) at least one intermodulation distortion (IMD) reduction component disposed in the feed forward path; and
(f) a circuit arrangement configured to convert a time domain representation of the IF signal output by the tunable receiver to a frequency domain representation, identify a plurality of carrier signals and an IMD product from the frequency domain representation of the IF signal, and control the IMD reduction component to suppress the IMD product at the output of the main signal path.

24. A method of suppressing an intermodulation distortion (IMD) product from an RF communications signal disposed in a frequency band, the method comprising:
(a) downconverting at least a portion of the frequency band for the RF communications signal to an Intermediate Frequency (IF) signal;
(b) converting a time domain representation of the IF signal to a frequency domain representation;
(c) identifying an IMD product from the frequency domain representation of the IF signal; and
(d) controlling an IMD reduction component to suppress the IMD product from the RF communications signal.

25. The method of claim 24, further comprising amplifying the RF communications signal with an amplifier.

26. The method of claim 24, wherein the RF communications signal is disposed within a main signal path, and wherein controlling the IMD reduction component comprises controlling a variable attenuator and a variable phase shifter disposed within a feed forward path coupled to the main signal path.

27. The method of claim 24, wherein the RF communications signal comprises a multi-carrier RF communications signal.

28. The method of claim 24, further comprising digitizing the IF signal, wherein converting the time domain representation of the IF signal comprises converting the digitized IF signal to the frequency domain representation.

29. The method of claim 24, wherein converting the time domain representation of the IF signal to the frequency domain representation is performed in a digital signal processing (DSP) using a Fast Fourier Transform (FFT).

30. The method of claim 24, wherein downconverting the portion of the frequency band to the IF signal is performed by a tunable receiver, the method further comprising:
(a) sequentially tuning the tunable receiver to a plurality of predetermined frequencies; and
(b) storing a frequency spectrum comprising the frequency domain representation of the IF signal when the tunable receiver is tuned to each of the plurality of predetermined frequencies.

31. The method of claim 30, further comprising:
(a) tuning the tunable receiver to a first plurality of predetermined frequencies to identify at least one wideband signal; and
(b) thereafter tuning the tunable receiver to a second plurality of predetermined frequencies to identify at least one narrowband signal.

32. The method of claim 30, further comprising identifying a carrier signal from the frequency domain representation of the IF signal by detecting a power peak in the frequency domain representation of the IF signal.

33. The method of claim 32, further comprising determining a modulation format for the carrier signal from the frequency domain representation of the IF signal.

34. The method of claim 32, further comprising identifying the IMD product by detecting a signal in the frequency domain representation of the IF signal that has a power level below a threshold used to identify a carrier signal.

35. The method of claim 32, further comprising identifying the IMD product based upon the location of the identified carrier signal.

36. The method of claim 30, further comprising:
(a) tuning the tunable receiver to a frequency proximate that for the IMD product; and
(b) monitoring a power level for the IMD product while controlling the IMD reduction component.

37. The method of claim 24, further comprising:
(a) identifying a plurality of carrier signals from the frequency domain representation of the IF signal; and
(b) determining from the plurality of carrier signals whether a channel configuration is valid.

* * * * *